Oct. 10, 1967 R. B. LOMERSON 3,346,773

MULTILAYER CONDUCTOR BOARD ASSEMBLY

Filed Nov. 21, 1966 2 Sheets-Sheet 1

ROBERT B. LOMERSON
INVENTOR.

BY Herbert J. Brown
ATTORNEY

ROBERT B. LOMERSON
INVENTOR.

BY Herbert J. Brown
ATTORNEY

United States Patent Office 3,346,773
Patented Oct. 10, 1967

3,346,773
MULTILAYER CONDUCTOR BOARD ASSEMBLY

Robert B. Lomerson, Fort Worth, Tex.,
assignor to Varo, Inc.

Filed Nov. 21, 1966, Ser. No. 595,815
4 Claims. (Cl. 317—100)

This invention relates to circuit boards and has reference to stacked circuits for conserving space. Generally, the invention is directed to stacked circuit boards having electrical devices connected with the laminated sides. An important feature of the invention has to do with straight conductor pins extending through all or a part of the stacked boards for completing circuits.

Multilayer boards have been used heretofore, but their high cost was a limiting factor. Additionally, such boards were limited in the complexity of their circuits in a given space, required highly skilled assemblers and did not effectively dissipate heat. Individual packages containing solid state or other devices were virtually impossible to replace. Thus, the failure of one device in a package, either during or after the manufacture of the assembly, required the scrapping of all committed packages.

The primary object of the invention is to provide a compact assembly capable of complex interconnection of circuits.

Another object is to provide multilayer conductor boards wherein generated heat is readily dissipated.

Another object is to provide an economical yet rugged assembly for the described purpose.

A particular object is to provide multilayer conductor boards having lateral conductors thereon for connection with the leads of packages containing minute printed circuits or other electrical devices whereby simple or complex circuitry may be assembled in a small space.

Another object is to provide a stacked arrangement of conductor boards having clip means on the laminated sides whereby the leads of packages may be electrically connected without soldering or welding and whereby a damaged package may be readily removed and replaced without dismantling the remainder of the assembly.

A further object is to provide a stacked arrangement of conductor boards and packages that is versatile in that circuit modification only requires changing the contact pattern. Also, the stacks may be connected with each other in side by side relation, and the conductor pins may extend to be received in pin sockets in a mother board or the like.

These and other objects of the invention will become apparent from the following description and the accompanying drawings, in which.

Figures 1, 2, 3, 4, 5, 8, 9:
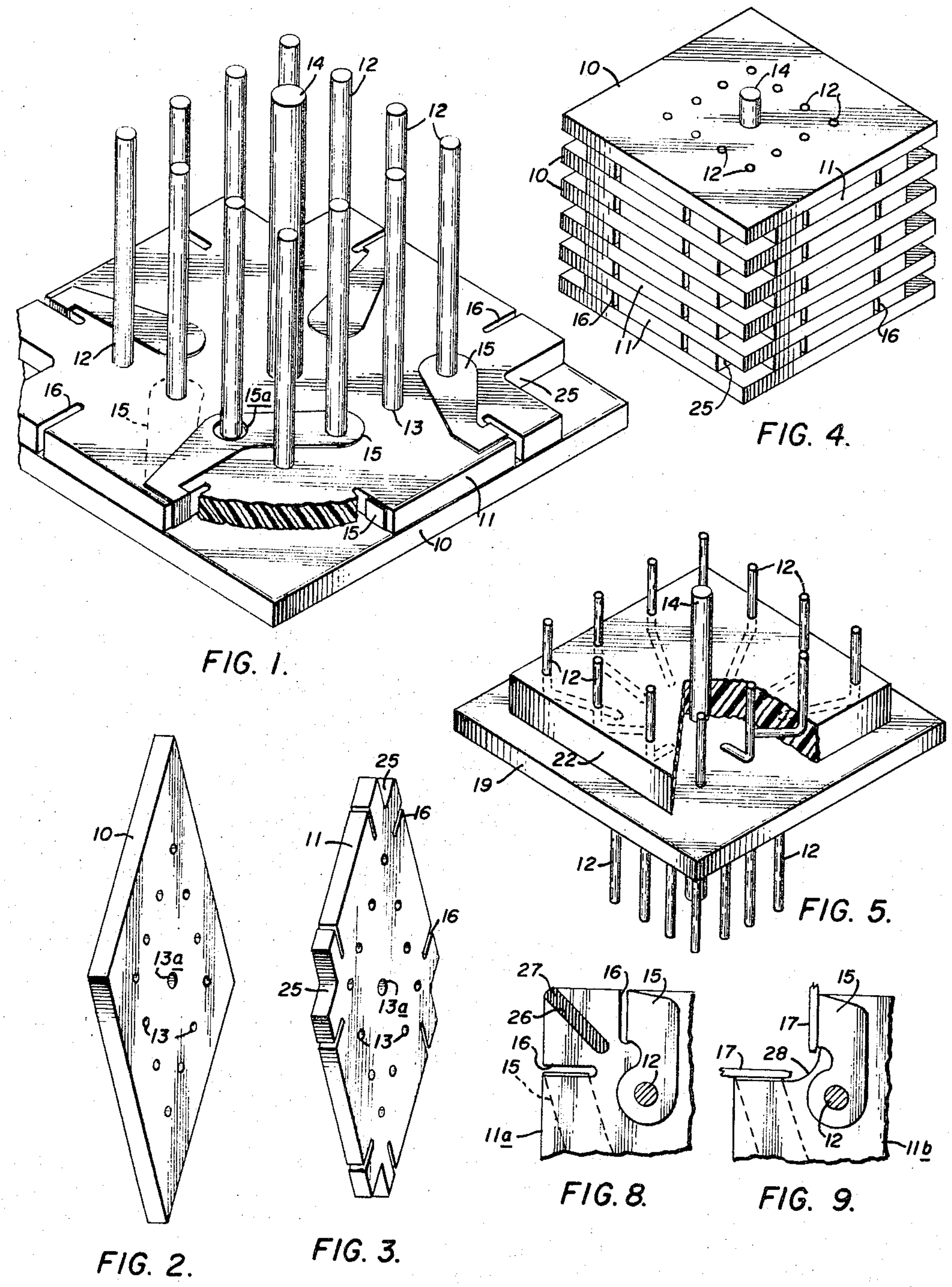
FIGURE 1 is a broken perspective view of a partly assembled stack according to the invention.
FIGURES 2 and 3 are, respectively, perspective views of an insulator and a conductor board which are parts of the referred to stack.
FIGURE 4 is a perspective view of a completed stack before the packages or other devices are connected.
FIGURE 5 is an inverted broken perspective view of the bottom portion of a stack showing, in a modified form of the invention, how extending ends of conductor pins may be dog legged to fit sockets.
FIGURE 8 is a broken plan view of a corner of a conductor board and showing slits or sockets for receiving the leads of packages.
FIGURE 9 is a view similar to FIGURE 8, but shows a modified form of the invention whereby the leads of attached devices may be welded or soldered in place.

A stack, according to the invention, consists of alternate layers of flat insulators 10 and conductor boards 11. Preferably, the insulators 10 and boards 11 are square as shown, but may be rectangular or of other shapes. Both are of insulating material, for example, phenolic resin or fiber glass. A feature of the invention has to do with conductor pins 12 which extend through correspondingly located holes 13 in the stacked alternate layers of insulators 10 and conductor boards 11. As will become apparent, any one conductor pin 12 does not have to extend entirely through any one stack, depending on the circuitry required. A larger diameter pin or bus 14 may extend entirely through the stack for heat removal. Holes 13*a* are provided through the insulators 10 and boards 11 to accommodate the buses 14.

Figures 6, 7, 10, 11, 12:
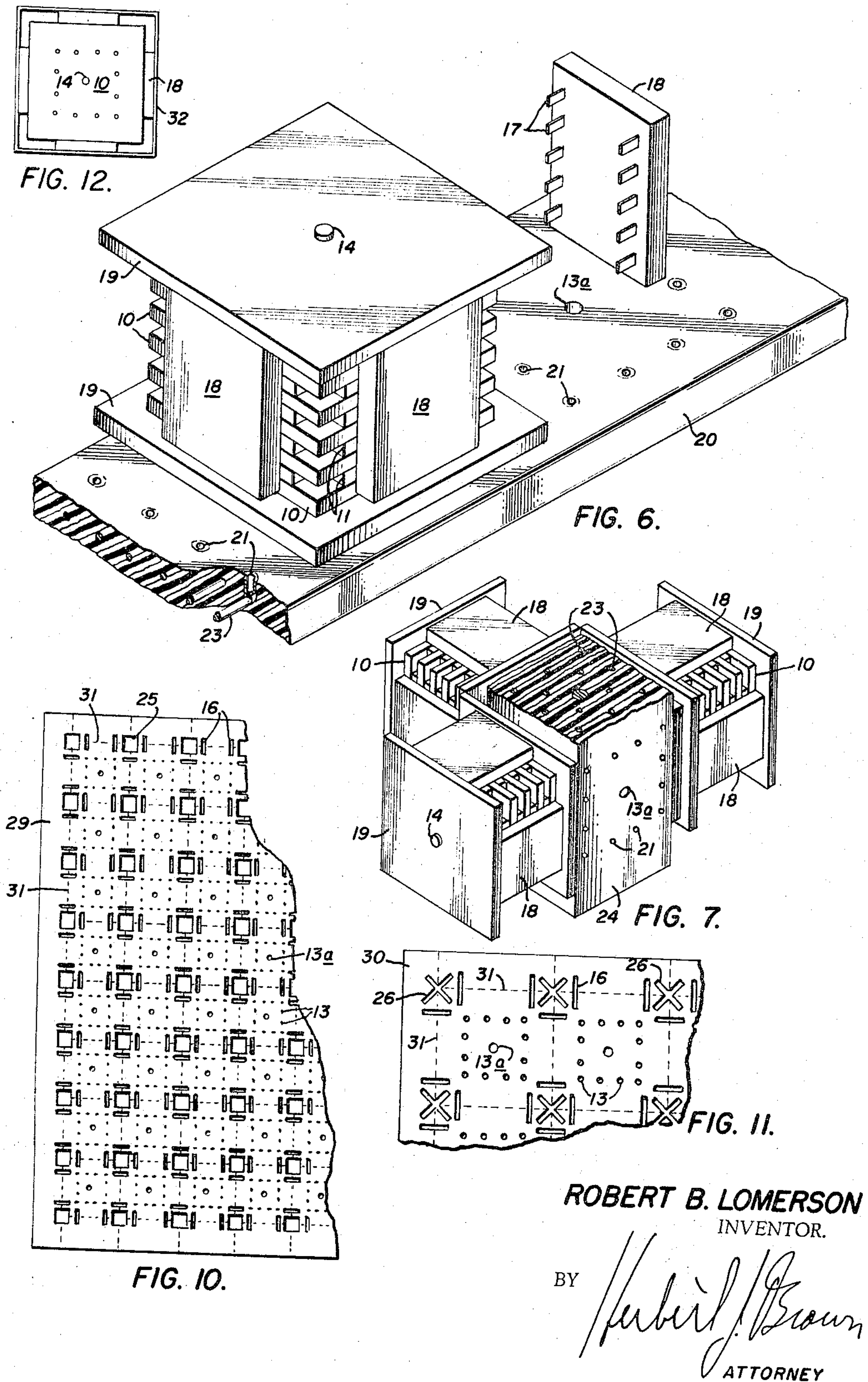
FIGURE 6 is a broken perspective view of a mother board and stack mounted thereon. Two packages are shown connected with the stack and one package is shown apart to illustrate the position of the leads for connection with the conductor boards.
FIGURE 7 is a broken perspective view of a multilayer board and several stacks and packages connected therewith.
FIGURE 10 is a broken plan view of a large sheet of material having a pattern of openings and slots therethrough, which sheet is subsequently severed along the dashed lines for making conductor boards such as shown in FIGURE 3.
FIGURE 11 is a view similar to FIGURE 10, but on an enlarged scale, showing a pattern for making conductor boards such as shown in FIGURE 8.
FIGURE 12 is a reduced scale plan view of a stack, packages thereon and an optional retaining band around the packages.

As best shown in FIGURES 1 and 3, lateral conductors 15 on both sides of the boards 11 connect selected conductor pins 12 with slots 16 in the edges of the boards near their corners. The slots 16 are aligned to receive the leads 17 of packages 18 as best shown in FIGURE 6. It is to be understood that all package leads 17 are not active, depending on the connections with the minute circuit within the package. The lateral conductors 15 extend to and partially cover a surface of an intended slot whereby contact with a lead 17 is made when a package 18 is inserted. The lateral conductors 15 may be of any suitable material such as separate metal pieces or may be printed or etched conductors. A conductor pin 12 may be by-passed by providing an enlarged opening 15*a* therearound. Enlarged flat pieces 19 of insulating material may be provided on the upper and lower ends of the stacks, but the buses 14 extend through these pieces so as to dissipate heat.

An exemplary installation is shown in FIGURE 6 wherein a stack is applied to a mother board 20. If the arrangement of the sockets 21 in the mother board 20 is larger than the arrangement of pins 12 in any one stack, the pins may be dog legged as shown in FIGURE 5. Here the pins 12 are bent outwardly where they are embedded in insulating material 22, and thence project through an end flat piece 19. The broken section in FIGURE 6 shows conductors 23 embedded in the mother board 20 for connection with the sockets 21.

Another installation is shown in FIGURE 7 wherein there is a multilayer mother board 24 and wherein the packages 18 are connected on three sides and sockets 21 are shown for receiving the pins 12 of an additional stack, not shown. Like the first mother board 20, the second mother board 24 has embedded conductors 23.

Other forms of conductor boards 11*a* and 11*b* are shown in FIGURES 8 and 9. In FIGURE 8 the corner notches 25 of FIGURE 3 are eliminated and the widths of the boards 11*a* are accordingly reduced, but the slots 16 on any one side are the same so as to accommodate the width between leads 17 on a standard size package 18.

The corners of the boards 11*a* may be diagonally slotted, at 26, to receive slightly wedge-shaped inserts 27 for partially closing the slots 16 and frictionally engaging the package leads 17 for electrical contact with the lateral conductors 15 where they extend into the slots.

The board 11*b* illustrated in FIGURE 9 is similar to the board 11*a* shown in FIGURE 8, but differs in that the corners are eliminated from slots 16 on the one side to slots 16 on the other. Thus, a notch 28 is provided at each corner whereby the package leads 17 may be welded or soldered to the lateral conductors 15.

The sheets of material 29 and 30 illustrated in FIGURES 10 and 11 have to do with patterns of openings for forming the boards 11 and 11*a* illustrated in FIGURES 3 and 8, respectively. In FIGURE 10 there are transverse and longitudinal rows of equally spaced square openings which become the corner notches 25, and around each square opening there are slots which become lead receiving slots 16. The sheet 29 is severed transversely and horizontally through the centers of the square openings as indicated by dash lines 31.

In FIGURE 11, instead of square openings, which become corner notches 25, there are crossed slots which become diagonal slots 26 when the sheet is severed along the dash lines 31. As before, there are slots around the cross slots which become lead receiving slots 16.

As shown in FIGURE 12, a stack may have a retaining band 32 around the packages 18 for holding the package leads 17 in electrical contact.

Several stacks may be placed one on another and have a connected or single bus 14. Also, the stacks may be in side by side relation by inserting short flat connectors, not shown, in opposing slots 16.

The invention is not limited to the exemplary constructions herein shown and described, but may be made in various ways within the scope of the appended claims.

What is claimed is:

1. A stacked circuit board assembly comprising: alternate layers of circuit boards and flat insulators of substantially the same planar dimensions, conductor pins extending perpendicularly through said boards and insulators, lateral conductors on said boards connecting selected said conductor pins with slots in the edges of said boards, and said slots having sides into which ends of said lateral conductors are received whereby the leads of electrical devices may be inserted and thereby make contact with said conductors.

2. A stacked circuit board assembly as defined in claim 1 and including a heat dissipating bus extending through said boards and said insulators, said heat dissipating bus being straight where it extends through said boards and insulators.

3. A stacked circuit board assembly as defined in claim 1 and wherein said boards are rectangular, the corners of said boards are notched and wherein some of said lateral conductors extend into said notched corners.

4. A stacked circuit board assembly as defined in claim 1 and wherein the extending ends of said conductor pins are dog legged and wherein the lateral portions thereof are embedded in insulating material.

References Cited

UNITED STATES PATENTS

| | | | |
|---|---|---|---|
| 2,774,014 | 12/1956 | Henry | 339—17 |
| 2,877,388 | 3/1959 | Reid et al. | 317—101 |
| 3,157,828 | 11/1964 | Flaherty | 317—100 |

ROBERT S. MACON, *Primary Examiner.*

ROBERT K. SCHAEFER, *Examiner.*

M. GINSBURG, *Assistant Examiner.*